(12) United States Patent
Andresakis

(10) Patent No.: US 6,606,792 B1
(45) Date of Patent: Aug. 19, 2003

(54) PROCESS TO MANUFACTURING TIGHT TOLERANCE EMBEDDED ELEMENTS FOR PRINTED CIRCUIT BOARDS

(75) Inventor: John A. Andresakis, Clifton Park, NY (US)

(73) Assignee: Oak-Mitsui, Inc., Hoosick Falls, NY (US)

(*) Notice: Subject to any disclaimer, the term of this patent is extended or adjusted under 35 U.S.C. 154(b) by 0 days.

(21) Appl. No.: 09/578,424

(22) Filed: May 25, 2000

(51) Int. Cl.[7] .............................. H05K 3/02; H05K 3/10
(52) U.S. Cl. .............................. 29/846; 29/852; 29/830; 427/97; 427/99
(58) Field of Search .................... 29/830, 846, 852; 439/67, 77, 492, 684, 722, 908; 427/97, 99

(56) References Cited

U.S. PATENT DOCUMENTS

| | | | |
|---|---|---|---|
| 4,075,420 A | * 2/1978 | Walton | 174/117 F |
| 4,368,252 A | 1/1983 | Kakuhashi et al. | 430/312 |
| 4,926,292 A | 5/1990 | Maple | 361/402 |
| 5,069,628 A | * 12/1991 | Crumly | 29/830 |
| 5,274,912 A | * 1/1994 | Olenick et al. | 29/852 |
| 5,674,596 A | 10/1997 | Johnson | 428/209 |
| 5,725,937 A | 3/1998 | Johnson | 428/209 |
| 5,942,314 A | 8/1999 | Fisher et al. | 428/198 |
| 6,000,124 A | * 12/1999 | Saito et al. | 29/830 |
| 6,247,229 B1 | * 6/2001 | Glenn | 29/841 |

FOREIGN PATENT DOCUMENTS

| | | |
|---|---|---|
| EP | 0600 925 | 1/1997 |
| EP | 0955642 A2 | 11/1999 |

OTHER PUBLICATIONS

Carpenter, et al "New Wmbedded Resistor Materials:High Tolerance And High Resistivity", IPC Printed Circuits Expo '99 Technical Proceedings; Mar. 14, 1999, pp. S02-3-1 to S02-3-4.

* cited by examiner

Primary Examiner—Richard Chang
(74) Attorney, Agent, or Firm—Roberts & Mercanti, LLP

(57) ABSTRACT

A process for forming printed circuit substrates incorporating impedance elements in which a pattern of impedance elements and a conductor pattern are incorporated on an insulating support. The process involves depositing a layer of an impedance material on a first surface of a sheet of an electrically highly conductive material and attaching a second surface of the sheet of highly conductive material to a support. Then one applies a layer of a photoresist material onto the layer of impedance material with imagewise exposure and development. After etching away the portion of the impedance layer material underlying the removed nonimage areas of the photoresist material, a pattern of impedance elements remain on the sheet of highly conductive material. Thus printed circuit board with impedance elements can be manufactured to a high degree of electrical tolerance.

31 Claims, 4 Drawing Sheets

PROCESS TO MANUFACTURING TIGHT TOLERANCE EMBEDDED ELEMENTS FOR PRINTED CIRCUIT BOARDS

BACKGROUND OF THE INVENTION

1. Field of the Invention

This invention relates to printed circuit substrates incorporating impedance elements, and more particularly to a printed circuit substrate which has a pattern of impedance elements and a conductor pattern incorporated on an insulating support. In this manner a printed circuit board with impedance elements can be manufactured to a high degree of tolerance.

2. Description of the Related Art

In one conventional method of producing a printed circuit board, an insulating support is provided with a resistance layer on the entire surface of the support, and a highly conductive material layer is positioned on the resistance layer. Using the conventional method, printed circuit substrate, an insulating region, a resistance region, and a conductor region are formed by a subtractive mask-etching method. In another prior art method, a printed circuit substrate is manufactured by covering a highly conductive material layer such as a copper foil with a removable masking sheet, and a resistance layer is formed on the other surface of the highly conductive material layer by electrodeposition. Then, the masking sheet is removed, and thereafter an insulating support is combined with the resistance layer. Thereafter, the surface of the copper foil is covered with photoresist, imagewise exposed to a conductor pattern and a resistor pattern in combination and developed such that the photoresist remains in the pattern regions. The copper foil in the region which is not covered with the photoresist is removed by etching, and the resistance layer exposed is removed by using an etching solution, as a result of which the surface of the insulating support is exposed. Then, the left photoresist is removed by using a removing solution. Thereafter, the substrate is covered with photoresist again, exposed through a photographic negative having the conductor pattern and the substrate developed to retain the photoresist in the conductor pattern region. The copper foil in the region which is not covered by the photoresist is removed by etching, as a result of which the surface of the resistance layer corresponding to the resistor pattern region is exposed. Then, the remaining photoresist is removed by using a removing solution. A solder stop-off or the like is applied to the resistance layer in the resistor pattern region by printing, and is then heated and cured to cover the resistance layer to achieve a printed circuit board with resistors. A drawback in the prior process is that, the resistance layer is thin and its mechanical strength is very low. The multiple developing steps thus causes variations in the sheet resistance and a variety of other characteristics.

In order to overcome these various difficulties, another method has been proposed in which the conductor pattern region of the circuit substrate is protected by a gold plating film, and in the final process the copper foil having a configuration corresponding to the resistor pattern region is removed by etching. However, persons skilled in the art will readily understand that in this method the processes are rather intricate requiring considerable skill. Another method of forming a printed circuit substrate is described in U.S. Pat. No. 4,368,252. This technique forms a resistor pattern film and a conductor pattern film on the two surfaces of a copper foil in a predetermined position. An insulating support is combined directly or indirectly with the resistor pattern film on the high conductive material layer. As is apparent from the above that conventional printed circuit substrate processing technique suffer from various disadvantages including a large number of intricate processing steps. Thus it takes a relatively long period of time for the processing, the manufacturing cost is high, the yield is limited, and the auxiliary material cost is high. In addition, embedded resistors made by using a resistive foil have electrical tolerances which are too high, i.e. on the order of ±10% of their desired values. A significant part of this variation is due to the inability to resolve the resistive pattern within tighter tolerances. This invention solves these problems.

According to the present invention, a printed circuit substrate with pre-formed impedance elements on a sheet of an electrically highly conductive material, attached to a support is manufactured. An insulating sheet is applied to the sheet of conductive material with the impedance elements therebetween. After removing the support from the sheet of conductive material the sheet of conductive material is etched to form a desired pattern such that at least some of the conductive lines contact at least some of the impedance elements. Optionally the another pattern of impedance elements and conductive lines are formed on an opposite side of the insulating sheet. As a result, impedance elements are formed on the insulating sheet which have much improved electrical tolerances.

SUMMARY OF THE INVENTION

The invention provides a process for forming a printed circuit substrate with impedance elements comprising performing steps (a) and (b) in either order:

(a) depositing a layer of an impedance material on a first surface of a sheet of an electrically highly conductive material;

(b) attaching a second surface of the sheet of highly conductive material to a support; then (c) applying a layer of a photoresist material onto the layer of impedance material;

(d) imagewise exposing the photoresist material thus forming image and nonimage areas, and then removing the nonimage areas while retaining the image areas;

(e) etching away the portion of the impedance layer material underlying the removed nonimage areas of the photoresist material, and then optionally removing the image areas of the photoresist material thus leaving a pattern of impedance elements on the sheet of highly conductive material.

Preferably the process further comprising the subsequent steps of:

(f) forming a plurality of target holes through the sheet of highly conductive material;

(g) attaching one side of a sheet of an insulating material to the sheet of highly conductive material such that the impedance elements are between the sheet of insulating material and the sheet of highly conductive material;

(h) removing the support from the sheet of highly conductive material;

(i) applying an additional layer of a photoresist material onto the second surface of the sheet of highly conductive material;

(j) imagewise exposing the additional layer of photoresist material thus forming image and nonimage areas, and then removing the nonimage areas while retaining the image areas;

(k) etching away the portion of the sheet of highly conductive material underlying the removed nonimage areas of the photoresist material, and then optionally removing the image areas of the photoresist material thus leaving a pattern of conductive lines of the highly conductive material such that at least some of the conductive lines contact at least some of the impedance elements.

More preferably the process provides the additional steps of performing steps (l) and (m) in either order:

(l) depositing a second layer of an impedance material on a first surface of a second sheet of electrically highly conductive material;

(m) attaching a second surface of the second sheet of highly conductive material to a support; then (n) applying a layer of a photoresist material onto the second layer of impedance material;

(o) imagewise exposing the photoresist material thus forming image and nonimage areas, and then removing the nonimage areas while retaining the image areas;

(p) etching away the portion of the second layer of impedance material underlying the removed nonimage areas of the photoresist material, and then optionally removing the image areas of the photoresist material thus leaving a pattern of second impedance elements on the second sheet of highly conductive material;

(q) forming a plurality of target holes through the second sheet of highly conductive material;

(r) attaching the second sheet of highly conductive material to another side of the sheet of an insulating material such that the second impedance elements are between the layer of insulating material and the second sheet of highly conductive material;

(s) removing the second support from the second sheet of highly conductive material;

(t) applying an additional layer of a photoresist material onto the rear side of the second sheet of highly conductive material;

(u) imagewise exposing the additional layer of photoresist material thus forming image and nonimage areas, and then removing the nonimage areas while retaining the image areas;

(v) etching away the portion of the second sheet of highly conductive material underlying the removed nonimage areas of the photoresist material, and then optionally removing the image areas of the photoresist material thus leaving a pattern of second conductive lines of the highly conductive material such that at least some of the second conductive lines contact at least some of the second impedance elements.

Another embodiment of the invention provides performing steps (a) and (b) in either order:

(a) depositing a pattern of impedance elements on a first surface of a sheet of electrically highly conductive material;

(b) attaching a second surface of the sheet of electrically highly conductive material to a support;

(c) forming a plurality of target holes through the sheet of highly conductive material;

(d) attaching one side of a sheet of an insulating material to the sheet of highly conductive material such that the impedance elements are between the sheet of insulating material and the sheet of highly conductive material;

(e) removing the support from the sheet of highly conductive material;

(f) applying a layer of a photoresist material onto the second surface of the sheet of highly conductive material;

(g) imagewise exposing the layer of photoresist material thus forming image and nonimage areas, and then removing the nonimage areas while retaining the image areas;

(h) etching away the portion of the sheet of highly conductive material underlying the removed nonimage areas of the photoresist material, and then optionally removing the image areas of the photoresist material thus leaving a pattern of conductive lines of the highly conductive material such that at least some of the conductive lines contact at least some of the impedance elements.

Preferably this embodiment further comprising performing steps (i) and (j) in either order:

(i) depositing a second pattern of impedance elements on a first surface of a second sheet of electrically highly conductive material;

(j) attaching a second surface of the second sheet of highly conductive material to a second support; then (k) forming a plurality of target holes through the second sheet of highly conductive material;

(l) attaching the second sheet of highly conductive material to another side of the sheet of an insulating material such that the second impedance elements are between the layer of insulating material and the second sheet of highly conductive material;

(m) removing the second support from the second sheet of highly conductive material;

(n) applying an additional layer of a photoresist material onto the rear side of the second sheet of highly conductive material;

(o) imagewise exposing the additional layer of photoresist material thus forming image and nonimage areas, and then removing the nonimage areas while retaining the image areas;

(p) etching away the portion of the second sheet of highly conductive material underlying the removed nonimage areas of the photoresist material, and then optionally removing the image areas of the photoresist material thus leaving a pattern of second conductive lines of the highly conductive material such that at least some of the second conductive lines contact at least some of the second impedance elements.

A third embodiment of the invention provides a process for forming a printed circuit substrate with impedance elements comprising performing steps (a) and (b) in either order:

(a) depositing a layer of a photosensitive impedance material on a first surface of a sheet of an electrically highly conductive material;

(b) attaching a second surface of the sheet of highly conductive material to a support; then (c) imagewise exposing the photosensitive impedance material thus forming image and nonimage areas, and then removing the nonimage areas while retaining the image areas thus leaving a pattern of impedance elements on the sheet of highly conductive material;

(d) forming a plurality of target holes through the sheet of highly conductive material;

(e) attaching one side of a sheet of an insulating material to the sheet of highly conductive material such that the impedance elements are between the sheet of insulating material and the sheet of highly conductive material;

(f) removing the support from the sheet of highly conductive material;

(g) applying a layer of a photoresist material onto the second surface of the sheet of highly conductive material;

(h) imagewise exposing the layer of photoresist material thus forming image and nonimage areas, and then removing the nonimage areas while retaining the image areas;

(i) etching away the portion of the sheet of highly conductive material underlying the removed nonimage areas of the photoresist material, and then optionally removing the image areas of the photoresist material thus leaving a pattern of conductive lines of the highly conductive material such that at least some of the conductive lines contact at least some of the impedance elements.

This embodiment preferably further provides performing steps (j) and (k) in either order:

(j) depositing a second layer of a photosensitive impedance material on a first surface of a second sheet of electrically highly conductive material;

(k) attaching a second surface of the second sheet of highly conductive material to a second support; then (l) imagewise exposing the photosensitive impedance material thus forming image and nonimage areas, and then removing the nonimage areas while retaining the image areas thus leaving a pattern of second impedance elements on the second sheet of highly conductive material;

(m) forming a plurality of target holes through the second sheet of highly conductive material;

(n) attaching the second sheet of highly conductive material to another side of the sheet of an insulating material such that the second impedance elements are between the layer of insulating material and the second sheet of highly conductive material;

(o) removing the second support from the second sheet of highly conductive material;

(p) applying a layer of a photoresist material onto the rear side of the second sheet of highly conductive material;

(q) imagewise exposing the layer of photoresist material thus forming image and nonimage areas, and then removing the nonimage areas while retaining the image areas;

(r) etching away the portion of the second sheet of highly conductive material underlying the removed nonimage areas of the photoresist material, and then optionally removing the image areas of the photoresist material thus leaving a pattern of second conductive lines of the highly conductive material such that at least some of the second conductive lines contact at least some of the second impedance elements.

DETAILED DESCRIPTION OF THE PREFERRED EMBODIMENT

Figure 1:
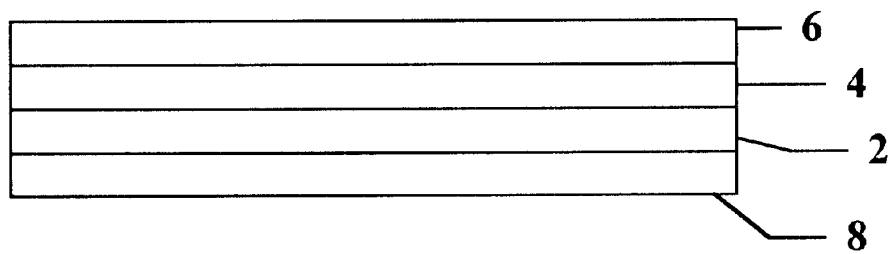
FIG. 1 shows a deposited layer of an impedance material on one side of a sheet of an electrically highly conductive material, a support on another surface of the sheet of conductive material and a layer of a photoresist on the impedance material.

FIG. 1 illustrates the first steps in the process for forming a printed circuit substrate. It comprises, in either order, depositing a layer of an impedance material 4 on a first surface of a sheet of an electrically highly conductive material 2 and then attaching a second surface of the sheet of highly conductive material 2 to a support 8. Then one applies a layer of a photoresist material 6 onto the layer of impedance material 4. In all of the drawing figures, the dimensions are not to scale.

Suitable materials for the electrically highly conductive material non-exclusively include foils composed of copper, aluminum, nickel, brass, gold, silver, stainless steel, tin, zinc or combinations thereof. Preferably such foils have a thickness of from about 12 $\mu$m to about 35 $\mu$m.

The impedance material is preferably a resistive material for the deposition of resistors on the conductive material, but may also include capacitive, inductive or active materials for the formation of transistors or other microelectronic devices. Typically they have a thickness of from about 100 nm to about 1000 nm. Resistive materials may comprise nickel, a nickel containing alloy, a semiconductor, or a combination of at least one metal or metal alloy and at least one insulator. Preferably the resistive material has a resistance of from about 25 to about 1000 ohms per square. Suitable capacitive materials comprise a polymeric material, a metal oxide, a semiconductor material or a combination thereof Preferably the capacitive material has a capacitance of from about 0.01 to about 3000 nanofarads per square centimeter, preferably from about 0.5 to about 2000 nanofarads per square centimeter. Suitable inductive materials non-exclusively include amorphous metals such as a composite of iron, boron and silica available as product 2605 SA1 from Honeywell Amorphous Metals, as well as product 2714 A which is a composite of cobalt, iron, boron and silica, also available from Honeywell Amorphous Metals. These are produced by pouring the molten metals into a chilled drum to rapidly cool the material and leave the result in an amorphous state. The inductive material may be deposited onto the conducting material by such techniques as plating, sputtering or vapor deposition. Preferably the inductive material has an inductance of from about 0.001 to 1 henry.

The support may comprise a metal, a polymer or a combination thereof. Suitable metals nonexclusively include aluminum and stainless steel. Preferably such supports have a thickness of from about 0.12 mm to about 0.51 mm. Preferably the support comprises a material capable of being ultrasonically bonded to the sheet of highly conductive material. Most preferably the support is ultrasonically bonded or welded to the sheet of highly conductive material by a technique disclosed in U.S. Pat. No. 5,942,314, which is incorporated herein by reference. The benefit of ultrasonic bonding is the ability to withstand chemical or thermal attack on the bond. This gives latitude to the techniques for applying and processing the impedance material.

The photoresist may be positive working or negative work and may be a liquid or dry film. When negative working photoresist compositions are exposed imagewise to radiation, the areas exposed to radiation become less soluble to a developing solution while the unexposed areas of the photoresist remain relatively soluble to a developing solution. Thus, treatment of an exposed negative working resist with a developer causes removal of the non-exposed areas of the resist coating thereby uncovering a desired portion of the underlying substrate surface on which the photoresist composition was deposited. When positive working photoresist compositions are exposed imagewise to radiation, those areas exposed to the radiation become more soluble to the developer solution while unexposed areas remain relatively insoluble to the developer solution. Thus, treatment of an exposed positive working photoresist with the developer causes removal of the exposed areas of the resist coating and the creation of a positive image in the photoresist coating. In either case a desired portion of the underlying substrate surface remains uncovered. Positive working photoresist compositions are favored over negative working resists because the former generally have better resolution. Suitable photoresist compositions are well known in the art and may include mixtures of o-quinone diazides with an aqueous alkali soluble or swellable binder resin such as a novolak or poly(4-hydroxystyrene). Suitable photoresists are described in U.S. Pat. Nos. 4,692,398; 4,835,086; 4,863,827 and 4,892,801. Suitable photoresists may be purchased commercially as AZ-4620 and AZ-111, from Clariant Corporation of Somerville, N.J.

In the process of the present invention, one coats and dries the foregoing photosensitive composition on a suitable substrate. The prepared resist solution can be applied to a substrate by any conventional method used in the photoresist art, including dipping, spraying, roller, whirling and spin coating. When spin coating, for example, the resist solution can be adjusted as to the percentage of solids content in order to provide coating of the desired thickness given the type of spinning equipment utilized and the amount of time allowed for the spinning process. In a preferred embodiment of the invention, the photoresist layer is formed by centrally applying a liquid photoresist composition to the upper surface on a rotating wheel at speeds ranging from about 500 to about 6000 rpm, preferably from about 1500 to about 4000 rpm, for about 5 to about 60 seconds, preferably from about 10 to about 30 seconds, in order to spread the composition evenly across the upper surface. The thickness of the photoresist layer may vary depending on the amount of liquid photoresist composition that is applied, but typically the thickness may range from about 500 Å to about 50,000 Å, and preferably from about 2000 Å to about 12000 Å. The amount of photoresist composition which is applied may vary from about 1 ml to about 10 ml, and preferably from about 2 ml to about 8 ml depending on the size of the substrate.

After the resist composition solution is coated onto the substrate, the substrate is temperature treated at approximately 20° C. to 200° C. This temperature treatment is done in order to reduce and control the concentration of residual solvents in the photoresist while not causing substantial thermal degradation of the photosensitizer. In general one desires to minimize the concentration of solvents and thus this temperature treatment is conducted until substantially all of the solvents have evaporated and a thin coating of photoresist composition, on the order of a micron in thickness, remains on the substrate. In a preferred embodiment the temperature is conducted at from about 50° C. to about 150° C. A more preferred range is from about 70° C. to about 90° C. This treatment is conducted until the rate of change of solvent removal becomes relatively insignificant. The temperature and time selection depends on the resist properties desired by the user as well as equipment used and commercially desired coating times. Commercially acceptable treatment times for hot plate treatment are those up to about 3 minutes, more preferably up to about 1 minute. In one example, a 30 second treatment at 90° C. is useful. Treatment times increase to about 20 to about 40 minutes when conducted in a convection oven at these temperatures.

After deposition onto the substrate, the photoresist layer is imagewise exposed, such as via an ArF laser or through an etch mask to actinic radiation. This exposure causes an imagewise differential between the image and non-image areas of the photoresist. The nonimage areas are then dissolved away in a developing solution. Preferably, UV radiation is used in an amount sufficient to render the exposed portions of the photoresist layer imagewise soluble is a suitable developer. UV exposure doses preferably range from about 5 mJ/cm$^2$ to about 300 mJ/cm$^2$, more preferably from about 5 mJ/cm$^2$ to about 100 mJ/cm$^2$ and still more preferably from about 10 mJ/cm$^2$ to about 30 mJ/cm$^2$.

The development step may be conducted by immersion in a suitable developing solution. The solution is preferably agitated, for example, by nitrogen burst agitation. The substrates are allowed to remain in the developer until all, or substantially all, of the resist coating has dissolved from the irradiated areas. Typical examples of the aqueous alkaline solutions suitable as the developer include sodium hydroxide, tetramethylammonium hydroxide, or aqueous solutions of hydroxides of metals belonging to the Groups I and II of the periodic table such as potassium hydroxide. Aqueous solutions of organic bases free from metal ions such as tetraalkylammonium hydroxide, for example, tetramethylammonium hydroxide (TMAH), tetraethylammonium hydroxide (TEAH) and tetrabutylammonium hydroxide (TBAH). More preferably, tetramethylammonium hydroxide (TMAH) are preferred. Furthermore, if desired, the aqueous basic solution used as the developer may additionally contain any additives such as a surface active agent in order to improve the resulting development effect.

Figure 2:
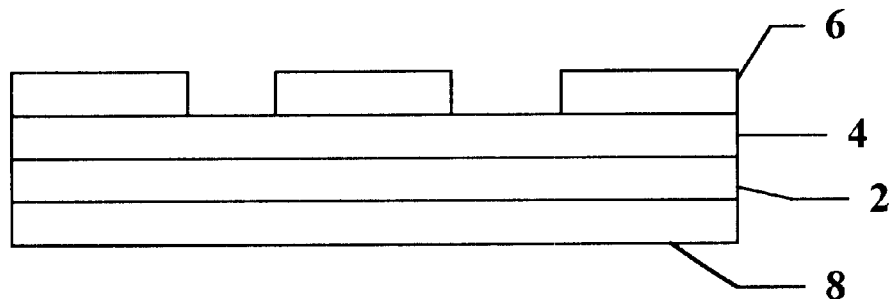
FIG. 2 shows the result after imagewise exposing the photoresist material, and then removing the nonimage areas while retaining the image areas.
Figure 3:
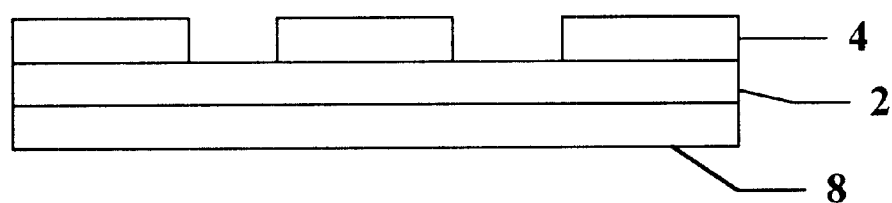
FIG. 3 shows the result after the impedance material is imagewise etched away in the areas of the impedance layer material underlying the removed nonimage areas of the photoresist material and the photoresist is then removed.
Figure 4:
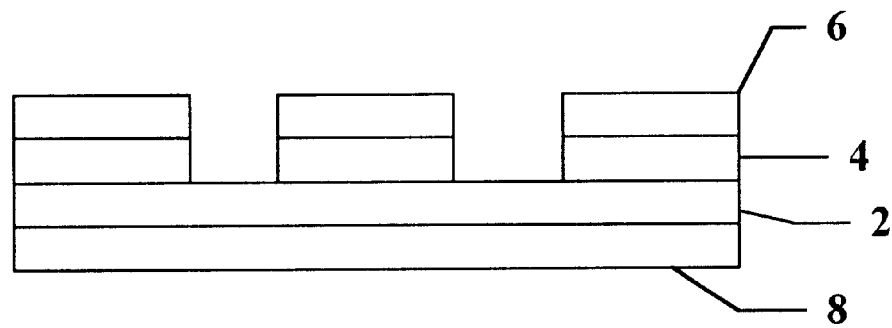
FIG. 4 shows the result after the impedance material is imagewise etched away in the areas of the impedance layer material underlying the removed nonimage areas of the photoresist material and the photoresist is not removed.

FIG. 2 shows the result after imagewise exposing the photoresist material thus forming image and nonimage areas, and then removing the nonimage areas while retaining the image areas. The impedance material is then etched away in the portions of the impedance layer material underlying the removed nonimage areas of the photoresist material thus leaving a pattern of impedance elements on the sheet of highly conductive material 6 as shown in FIG. 3. Etching of the impedance material may be done by contacting the impedance material with an etchant which may be done by horizontal or vertical conveyorized spray type equipment. Plasma systems may also be used to dry etch the material. In FIG. 3 the balance of the photoresist has been removed and in FIG. 4, the balance of the photoresist is not removed.

Figure 5:
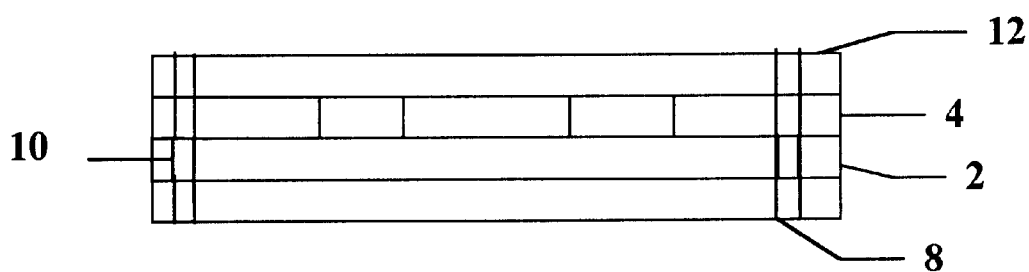
FIG. 5 shows target holes drilled through the sheet of highly conductive material and a sheet of an insulating material attached to the sheet of highly conductive material.

Then one side of a sheet of an insulating material 12 is attached to the sheet of highly conductive material such that the impedance elements are between the sheet of insulating material 12 and the sheet of highly conductive material 2. In the preferred embodiment of the invention as shown in FIG. 5, one then drills two or more target or guide holes 10 through the sheet of highly conductive material 2, support 8, insulating material 12 and optionally some impedance elements 4, which holes serve to facilitate registration of the pattern of impedance material with the subsequently formed metal lines.

The sheet of insulating material may comprise a thermoset or thermoplastic polymer with or without reinforcement. Suitable insulating materials are laminated structures made of epoxy resin-glass cloth, polyester-glass cloth, polyimide-glass cloth, polyamidoimide-glass cloth, phenol resin-paper, and epoxy resin-paper; polyimide; polyester; polyamidoimide; and a flexible insulating sheet or film made of flexible epoxy resin-glass cloth or flexible polyamide-paper. Inorganic materials such as ceramic plates, and glass plates in which resins and rubbers such as epoxy resin, polyester, polyurethane, polyamideimide, polyimide and rubber are employed as adhesive layers, can also be employed as the insulating material. Preferably the sheet of insulating material comprises an epoxy or polyimide.

Figure 6:
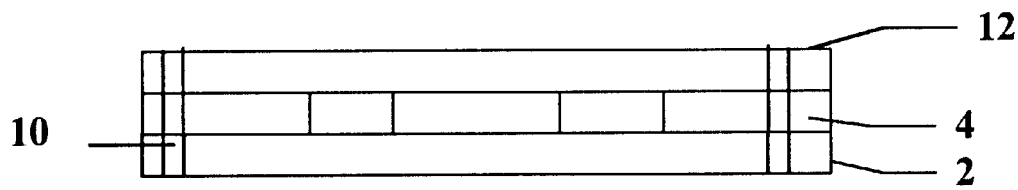
FIG. 6 shows the result after the support is removed.
Figure 7:
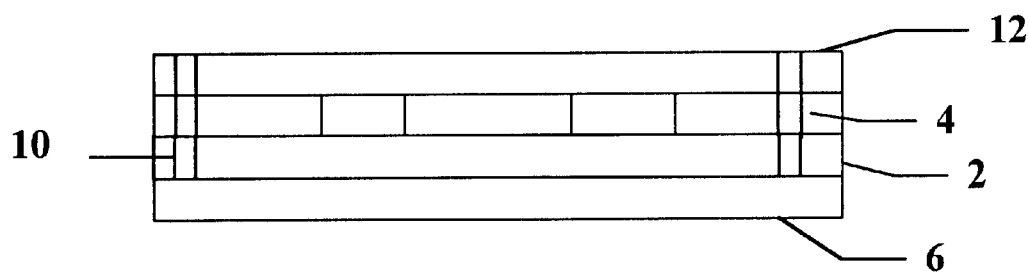
FIG. 7 shows another layer of photoresist applied to the back side of the sheet of highly conductive material.
Figure 8:
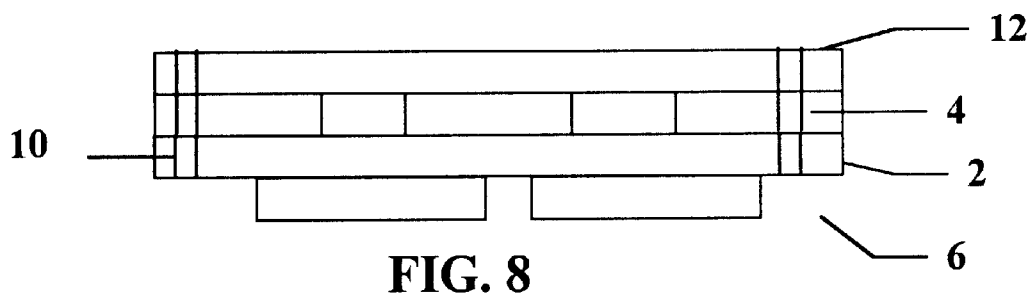
FIG. 8 shows the photoresist after exposure and development.
Figure 9:
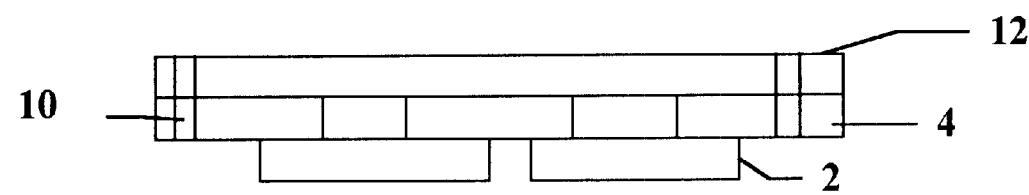
FIG. 9 shows the result after etching away the highly conductive material underlying the removed areas of the photoresist material, leaving a pattern of conductive lines contacting some of the impedance elements.

Then the support 8 is removed to form the result of FIG. 6. Then another layer of photoresist 6 is applied to the back side of the sheet of highly conductive material as shown in FIG. 7. This photoresist is then exposed and developed in a manner similar to that described above to form the result of FIG. 8. One then etches away the portion of the sheet of highly conductive material underlying the removed nonimage areas of the photoresist material, and then optionally removing the image areas of the photoresist material thus leaving a pattern of conductive lines of the highly conductive material such that at least some of the conductive lines contact at least some of the impedance elements as shown in FIG. 9. Well known etching solutions can be employed as the etching solution for the conductive material layer. For instance, in the case of copper foils, such may be ferric chloride, ammonium persulfate, cupric chloride, a chromic acid sulfuric acid mixture solution, and a variety of ammonia chelate-type etching solution is employed by taking into consideration the corrosion resistance of the material of the impedance material. The conductive lines are formed such that at least some of the impedance elements contact at least two conductive lines at different contact points of the impedance elements wherein the distance between the contact points range from about 0.025 mm to about 100 mm.

Figure 10:
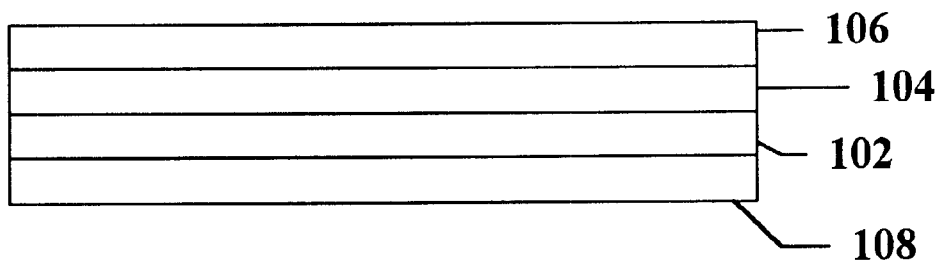
FIG. 10 shows a second layer of an impedance material on a second sheet of an electrically highly conductive material which is attached to a second support and having another layer of a photoresist material on the second layer of impedance material.

FIGS. 10 through 17 show another embodiment of the invention where another layer of impedance elements and lines are produced on the opposite side of the sheet of insulating material 12. This FIG. 10 shows a second deposited a layer of an impedance material 104 on a first surface of a second sheet of an electrically highly conductive material 102 and then attaching a second surface of the sheet of highly conductive material 102 to a second support 108. Then one applies another layer of a photoresist material 106 onto the second layer of impedance material 104.

Figure 11:
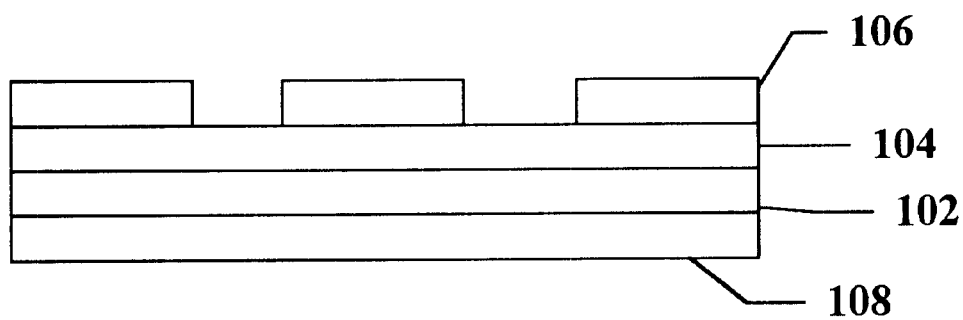
FIG. 11 shows the result after imagewise exposing the photoresist material, and then removing the nonimage areas while retaining the image areas.
Figure 12:
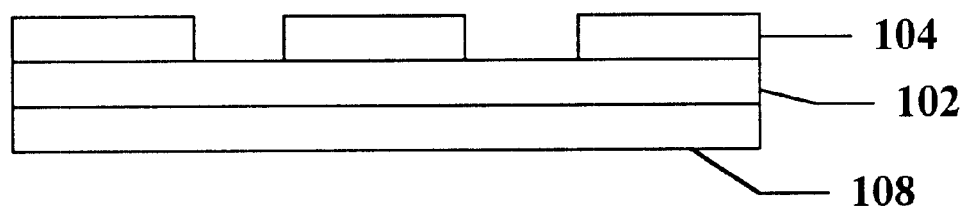
FIG. 12 shows the result after the impedance material is imagewise etched away in the areas of the impedance layer material underlying the removed nonimage areas of the photoresist material to form impedance elements and the photoresist is then removed.
Figure 13:
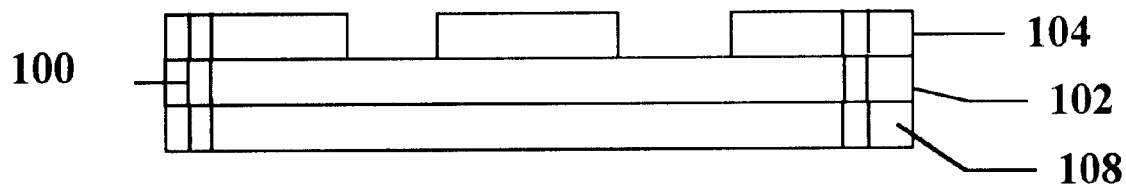
FIG. 13 shows target holes drilled through the sheet of highly conductive material.
Figure 14:
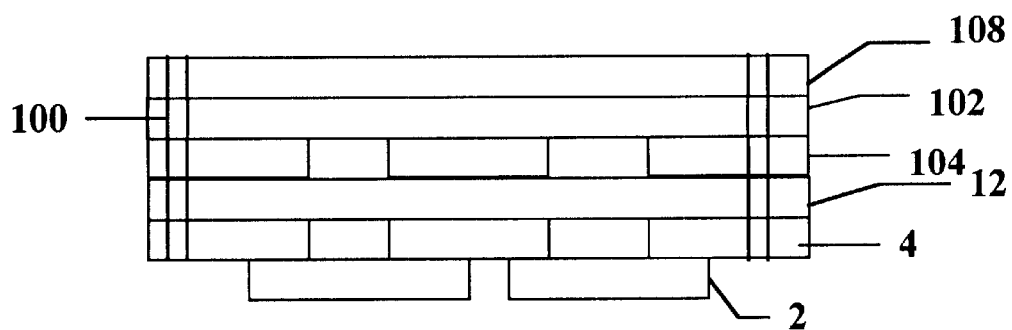
FIG. 14 shows the result of attaching the second sheet of highly conductive material to the rear side of the sheet of an insulating material.
Figure 15:
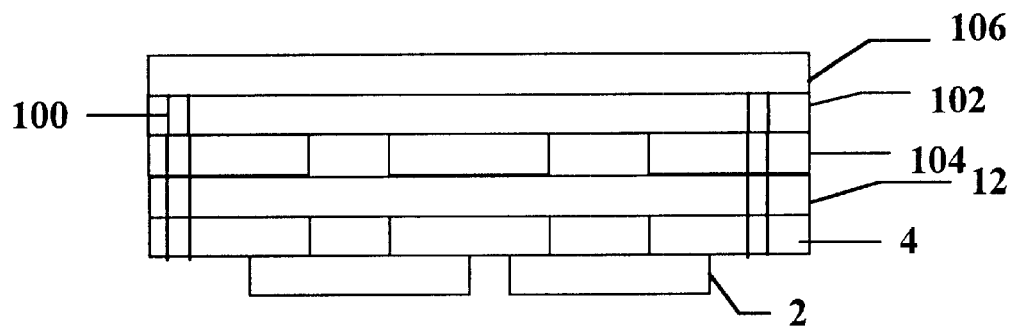
FIG. 15 shows the second support removed from the second sheet of highly conductive material and another layer of photoresist is applied to the rear of the conductive sheet.
Figure 16:
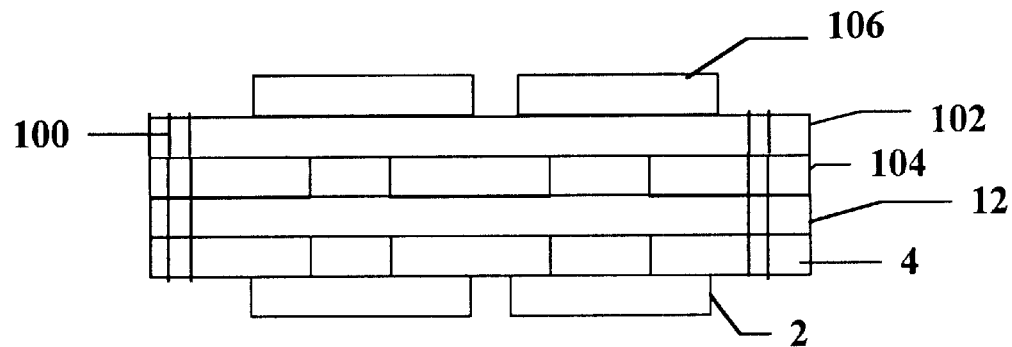
FIG. 16 shows the result after the photoresist has been imagewise exposed and developed.
Figure 17:
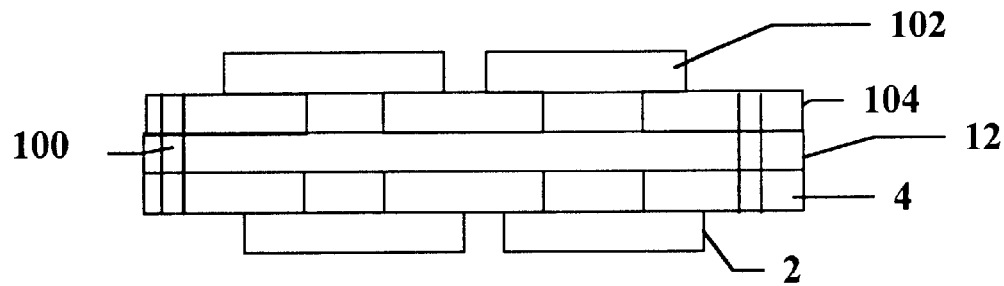
FIG. 17 shows the result after the second conductive sheet has been etched to form conductive lines and the photoresist has been removed.

FIG. 11 shows the result after imagewise exposing the second photoresist material 106, and then removing the nonimage areas while retaining the image areas. FIG. 12 shows the result after the second impedance material 104 is imagewise etched away in the areas of the impedance layer material underlying the removed nonimage areas of the photoresist material 106 and the photoresist is then removed. The etching and photoresist removal is done similarly to the steps described above. The option of retaining the photoresist is not shown. FIG. 13 shows target holes 100 drilled through the sheet of highly conductive material 102, support 108 and optionally some impedance elements 104. FIG. 14 shows the result of attaching the second sheet of highly conductive material 102 to the rear side of the sheet of an insulating material 12 such that the second impedance elements 104 are between the layer of insulating material 12 and the second sheet of highly conductive material 102. Then the second support 108 is removed from the second sheet of highly conductive material 102 and another layer of photoresist 106 is applied to the rear of sheet 102 as shown in FIG. 15. FIG. 16 shows the result after the photoresist 106 has been imagewise exposed and developed. FIG. 17 shows the product where the second sheet of highly conductive material 102 has been etched to form a second pattern of conductive lines in contact with the second pattern of impedance elements on the rear of the sheet of insulating material 12. Although one sheet of insulating material has been shown as prepared with impedance elements and conductive lines on both sides, it is within the contemplation of the invention that structures may be formed having additional layers of impedance elements, conductive lines and insulting sheets or layers.

Although the above description sets forth details in which the impedance elements are formed via the application of a full sheet of impedance material to a sheet of conductive material with subsequent patterning by means of photoresist imaging and etching to form impedance elements, it is within the contemplation of the invention that the impedance elements can also be formed by depositing a pattern of impedance elements onto the sheet of electrically highly conductive material. Such may be done, for example by directly depositing an polymeric ink having various metal loadings as a pattern of impedance elements. Such polymer inks include those available from Ormet, of San Diego, Calif.,. Electra Polymers of Kent, England and Parelec, of Rocky Hill, N.J. Such depositing may be done by a well known screen printing process. Alternatively, the impedance material itself may be photosensitive. A layer of it may be applied onto the conductive material and imaged by standard lithographic imaging and developing techniques. Suitable photosensitive impedance materials include those available from Ciba Geigy of Basil, Switzerland, and Electra Polymers.

The following non-limiting examples serve to illustrate the invention.

EXAMPLE 1

A resistive layer of nickel phosphate is plated onto a roll of electro-deposited copper foil. The roll of copper foil is passed through an ultrasonic bonding machine along with a roll of aluminum as a support element. This welds the two materials together along the edges, with the resistor layer facing outwards. It is then cut into individual sheets (now referred to as the panel). A photoresist dryfilm is applied to the resistive layer by use of a hot roll laminator and is exposed using silver halide artwork and an UV exposure unit. The unexposed resist is developed away in a carbonate solution, exposing the nickel phosphate layer. This layer is removed by etching in a cupric chloride solution, thus leaving behind the now defined resistor elements. The photoresist is then stripped in a caustic solution (KOH). In addition, targets have been defined in the border area of the panel for reference. Using these targets, tooling holes are punched into the panel. These tooling holes will be used for reference, i.e. imaging of the circuits into the copper from the topside to the resistors on the other side. The panel is then oxided to passivate the exposed copper and provide for good adhesion during the next step. The panel is then placed on tooling pins in a registration plate and an epoxy prepreg is placed against the resistor layer. On the other side, another panel with a resistor layer on copper supported by aluminum can be placed or a copper layer can be used. The panel is pressed under heat and pressure necessary to cure the resin. After pressing, the panel is trimmed to remove the resin flash and the aluminum separator is removed. The core that is formed can now be finished by applying a layer of photoresist to both sides and exposing using a silver halide artwork and UV expose unit. The artwork is aligned to the core using the tooling holes previously made. The unexposed areas are developed away and the copper is etched using an ammoniacal etch that will not attack the nickel phosphate resistors below. The photoresist is then stripped leaving a finished core. The conductive traces are now formed on top of the resistive elements to complete the circuits. The core is oxided to passivate the copper and give better adhesion and laminated with other cores into a multilayer printed circuit board.

EXAMPLE 2

The process of Example 1 is repeated except the photoresist is not stripped after etching of the resistive element.

EXAMPLE 3

A roll of copper foil is attached to roll of aluminum support element using an ultrasonic bonding machine. The rolls are cut into individual panels. Tooling holes are punched into the panel for reference for the subsequent operations. Onto the copper side of the panel (the copper foil is bonded to the aluminum with the treatment side facing either inward or outward) is applied a resistive ink using a screen printing technique. Alternatively, the ink can be applied using an automated dispensing system. The ink is dried and cured in an oven. This forms the resistor elements. The panel is placed on tooling pins in a registration plate and prepreg (semi-cured epoxy on fiberglass) is placed against the resistor elements. On the other side of the prepreg is placed another panel with resistive elements or just a sheet of copper foil (also attached to aluminum). The panel is laminated under heat and pressure to cure the prepreg. The panels are removed from the press and trimmed. The aluminum is removed and the copper imaged as per the process in Example 1.

EXAMPLE 4

Example 3 is repeated except the resistive material is photosensitive and is put down on the entire copper surface. It is then imaged using a silver halide artwork and an UV expose unit with the unexposed area being developed off. The remaining resistive material is fully cured in an oven and then it follows the process flow as in Example 3.

While the present invention has been particularly shown and described with reference to preferred embodiments, it will be readily appreciated by those of ordinary skill in the art that various changes and modifications may be made without departing from the spirit and scope of the invention. It is intended that the claims be to interpreted to cover the disclosed embodiment, those alternatives which have been discussed above and all equivalents thereto.

What is claimed is:

1. A process for forming a printed circuit substrate with impedance elements comprising performing step (a) or (b):

(a) depositing a layer of an impedance material on a first surface of a sheet of an electrically highly conductive material and attaching a second surface of the sheet of electrically highly conductive material to a support; then;

(b) attaching a second surface of a sheet of electrically highly conductive material to a support and depositing a layer of an impedance material on a first surface of the sheet of electrically highly conductive material; then (c) applying a layer of a photoresist material onto the layer of impedance material;

(d) imagewise exposing the photoresist material thus forming image areas and nonimage areas, and then removing the nonimage areas while retaining the image areas;

(e) etching away a portion of the impedance layer material underlying the removed nonimage areas of the photoresist material, and then optionally removing the image areas of the photoresist material thus leaving a pattern of impedance elements on the sheet of electrically highly conductive material, (f) forming a plurality of target holes through the sheet of electrically highly conductive material;

(g) attaching one side of a sheet of insulating material to the sheet of electrically highly conductive material such that the impedance elements are between the sheet of insulating material and the sheet of electrically highly conductive material;

(h) removing the support from the sheet of electrically highly conductive material;

(i) applying an additional layer of a photoresist material onto the second surface of the sheet of electrically highly conductive material;

(j) imagewise exposing the additional layer of photoresist material thus forming image and nonimage areas, and then removing the nonimage areas while retaining the image areas;

(k) etching away the portion of the sheet of electrically highly conductive material underlying the removed nonimage areas of the photoresist material, and then optionally removing the image areas of the photoresist material thus leaving a pattern of conductive lines of the highly conductive material such that at least some of the conductive lines contact at least some of the impedance elements.

2. The process of claim 1 further comprising performing step (l) or (m):

(l) depositing a second layer of an impedance material on a first surface of a second sheet of electrically highly conductive material and attaching a second surface of the second sheet of electrically highly conductive material to a second support; then (m) attaching a second surface of a second sheet of electrically highly conductive material to a second support depositing a second layer of an impedance material on a first surface of the second sheet of electrically highly conductive material; then (n) applying a layer of a photoresist material onto the second layer of impedance material;

(o) imagewise exposing the photoresist material thus forming image and nonimage areas, and then removing the nonimage areas while retaining the image areas;

(p) etching away the portion of the second layer of impedance material underlying the removed nonimage areas of the photoresist material, and then optionally removing the image areas of the photoresist material thus leaving a pattern of second impedance elements on the second sheet electrically of highly conductive material;

(q) forming a plurality of target holes through the second sheet of electrically highly conductive material;

(r) attaching the second sheet of electrically highly conductive material to another side of the sheet of insulating material such that the second impedance elements are between the sheet of insulating material and the second sheet of electrically highly conductive material;

(s) removing the second support from the second sheet of electrically highly conductive material;

(t) applying an additional layer of a photoresist material onto the rear side of the second sheet of electrically highly conductive material;

(u) imagewise exposing the additional layer of photoresist material thus forming image and nonimage areas, and then removing the nonimage areas while retaining the image areas;

(v) etching away the portion of the second sheet of electrically highly conductive material underlying the removed nonimage areas of the photoresist material, and then optionally removing the image areas of the photoresist material thus leaving a pattern of second conductive lines of the electrically highly conductive material such that at least some of the second conductive lines contact at least some of the second impedance elements.

3. The process of claim 1 wherein in step (e) the removing of the image areas of the photoresist material is conducted.

4. The process of claim 2 wherein in step (v) the removing of the image areas of the photoresist material is conducted.

5. The process of claim 1 wherein the highly conductive material comprises copper, nickel, aluminum, gold, silver, brass or stainless steel.

6. The process of claim 1 wherein the impedance material comprises a resistive material.

7. The process of claim 6 wherein the resistive material comprises nickel, a nickel containing alloy, a semiconductor, or a combination of at least one metal or metal alloy and at least one insulator.

8. The process of claim 6 wherein the resistive material has a resistance of from about 25 to about 1000 ohms per square.

9. The process of claim 1 wherein the impedance material comprises a capacitive material.

10. The process of claim 9 wherein the capacitive material comprises a polymeric material, a metal oxide, a semiconductor material or a combination thereof.

11. The process of claim 9 wherein the capacitive material has a capacitance of from about 0.01 to about 3000 nanofarads per square centimeter.

12. The process of claim 1 wherein the support comprises a material capable of being ultrasonically bonded to the sheet of highly conductive material.

13. The process of claim 1 wherein the support is ultrasonically bonded to the sheet of electrically highly conductive material.

14. The process of claim 1 wherein the support comprises a metal, a polymer or a combination thereof.

15. The process of claim 1 wherein the support comprises aluminum.

16. The process of claim 1 wherein the support comprises stainless steel.

17. The process of claim 1 wherein the photoresist material is applied as a liquid.

18. The process of claim 1 wherein the photoresist material is applied as a dry film.

19. The process of claim 1 wherein the sheet of insulating material comprises an epoxy or polyimide.

20. The process of claim 1 wherein the sheet of insulating material comprises a thermoset or thermoplastic polymer with or without reinforcement.

21. The process of claim 1 wherein at least some of the impedance elements contact at least two conductive lines at different contact points of the impedance elements wherein the distance between the contact points range from about 0.025 mm to about 100 mm.

22. The process of claim 1 wherein the electrically highly conductive material comprises copper, the impedance material comprises nickel or a nickel alloy, and the support comprises aluminum.

23. The process of claim 1 wherein the electrically highly conductive material comprises copper, the impedance material comprises nickel or a nickel alloy, the support comprises aluminum, and the insulating material comprises an epoxy.

24. The process of claim 2 wherein the electrically highly conductive material comprises copper, the impedance material comprises nickel or a nickel alloy, the support comprises aluminum, the insulating material comprises an epoxy, the second highly conductive material comprises copper, the second impedance material comprises nickel or a nickel alloy, and the second support comprises aluminum.

25. A process for forming a printed circuit substrate with impedance elements comprising performing step (a) or (b):

(a) depositing a pattern of impedance elements on a first surface of a sheet of electrically highly conductive material and attaching a second surface of the sheet of electrically highly conductive material to a support;

(b) attaching a second surface of a sheet of electrically highly conductive material to a support and depositing a pattern of impedance elements on a first surface of the sheet of electrically highly conductive material;

(c) forming a plurality of target holes through the sheet of electrically highly conductive material;

(d) attaching one side of a sheet of an insulating material to the sheet of electrically highly conductive material such that the impedance elements are between the sheet of insulating material and the sheet of electrically highly conductive material;

(e) removing the support from the sheet of electrically highly conductive material;

(f) applying a layer of a photoresist material onto the second surface of the sheet of electrically highly conductive material;

(g) imagewise exposing the layer of photoresist material thus forming image and nonimage areas, and then removing the nonimage areas while retaining the image areas;

(h) etching away the portion of the sheet of electrically highly conductive material underlying the removed nonimage areas of the photoresist material, and then optionally removing the image areas of the photoresist material thus leaving a pattern of conductive lines of the electrically highly conductive material such that at least some of the conductive lines contact at least some of the impedance elements.

26. The process of claim 25 further comprising performing step (i) or (j):

(i) depositing a second pattern of impedance elements on a first surface of a second sheet of electrically highly conductive material and attaching a second surface of the second sheet of electrically highly conductive material to a second support; then (j) attaching a second surface of a second sheet of electrically highly conductive material to a second support and depositing a second pattern of impedance elements on a first surface of the second sheet of electrically highly conductive material; then (k) forming a plurality of target holes through the second sheet of electrically highly conductive material;

(l) attaching the second sheet of electrically highly conductive material to another side of the sheet of an insulating material such that the second impedance elements are between the layer of insulating material and the second sheet of electrically highly conductive material;

(m) removing the second support from the second sheet of electrically highly conductive material;

(n) applying an additional layer of a photoresist material onto the rear side of the second sheet of electrically highly conductive material;

(o) imagewise exposing the additional layer of photoresist material thus forming image and nonimage areas, and then removing the nonimage areas while retaining the image areas;

(p) etching away the portion of the second sheet of electrically highly conductive material underlying the removed nonimage areas of the photoresist material, and then optionally removing the image areas of the photoresist material thus leaving a pattern of second conductive lines of the electrically highly conductive material such that at least some of the second conductive lines contact at least some of the second impedance elements.

27. The process of claim 25 wherein the impedance elements comprise a polymeric ink.

28. The process of claim 25 wherein the impedance elements are deposited by a screen printing process.

29. A process for forming a printed circuit substrate with impedance elements comprising performing step (a) or (b):

(a) depositing a layer of a photosensitive impedance material on a first surface of a sheet of an electrically highly conductive material attaching a second surface of the sheet of electrically highly conductive material to a support; then (b) attaching a second surface of a sheet of electrically highly conductive material to a support and depositing a layer of a photosensitive impedance material on a first surface of the sheet of electrically highly conductive material; then (c) imagewise exposing the photosensitive impedance material thus forming image and nonimage areas, and then removing the nonimage areas while retaining the image areas thus leaving a pattern of impedance elements on the sheet of electrically highly conductive material;

(d) forming a plurality of target holes through the sheet of electrically highly conductive material;

(e) attaching one side of a sheet of an insulating material to the sheet of electrically highly conductive material such that the impedance elements are between the sheet of insulating material and the sheet of electrically highly conductive material;

(f) removing the support from the sheet of electrically highly conductive material;

(g) applying a layer of a photoresist material onto the second surface of the sheet of electrically highly conductive material;

(h) imagewise exposing the layer of photoresist material thus forming image and nonimage areas, and then removing the nonimage areas while retaining the image areas;

(i) etching away the portion of the sheet of electrically highly conductive material underlying the removed nonimage areas of the photoresist material, and then optionally removing the image areas of the photoresist material thus leaving a pattern of conductive lines of the electrically highly conductive material such that at least some of the conductive lines contact at least some of the impedance elements.

30. The process of claim 29 further comprising performing step (j) or (k):

(j) depositing a second layer of a photosensitive impedance material on a first surface of a second sheet of electrically highly conductive material and attaching a second surface of the second sheet of electrically highly conductive material to a second support; then (k) attaching a second surface of a second sheet of electrically highly conductive material to a second support.and depositing a second layer of a photosensitive impedance material on a first surface of the second sheet of electrically highly conductive material; then (l) imagewise exposing the photosensitive impedance material thus forming image and nonimage areas, and then removing the nonimage areas while retaining the image areas thus leaving a pattern of second impedance elements on the second sheet of electrically highly conductive material;

(m) forming a plurality of target holes through the second sheet of electrically highly conductive material;

(n) attaching the second sheet of electrically highly conductive material to another side of the sheet of an insulating material such that the second impedance elements are between the layer of insulating material and the second sheet of electrically highly conductive material;

(o) removing the second support from the second sheet of electrically highly conductive material;

(p) applying a layer of a photoresist material onto the rear side of the second sheet of electrically highly conductive material;

(q) imagewise exposing the layer of photoresist material thus forming image and nonimage areas, and then removing the nonimage areas while retaining the image areas;

(r) etching away the portion of the second sheet of electrically highly conductive material underlying the removed nonimage areas of the photoresist material, and then optionally removing the image areas of the photoresist material thus leaving a pattern of second conductive lines of the electrically highly conductive material such that at least some of the second conductive lines contact at least some of the second impedance elements.

31. A process for forming a printed circuit substrate with impedance elements comprising performing steps (a) and (b) in either order:

(a) depositing a layer of an impedance material on a first surface of a sheet of an electrically highly conductive material;

(b) attaching a second surface of the sheet of electrically highly conductive material to a support; then (c) applying a layer of a photoresist material onto the layer of impedance material;

(d) imagewise exposing the photoresist material thus forming image and nonimage areas, and then removing the nonimage areas while retaining the image areas;

(e) etching away a portion of the impedance layer material underlying the removed nonimage areas of the photoresist material, and then optionally removing the image areas of the photoresist material thus leaving a pattern of impedance elements on the sheet of electrically highly conductive material;

wherein impedance material comprises a capacitive material having a capacitance of from about 0.01 to about 3000 nanofarads per square centimeter, a resistive material having a resistance of from about 25 to about 1000 ohms per square, or an inductive material having an inductance of from about 0.001 to 1 henry.

* * * * *